United States Patent
Pakdaman et al.

(10) Patent No.: US 6,778,327 B2
(45) Date of Patent: Aug. 17, 2004

(54) BI-CONVEX SOLID IMMERSION LENS

(75) Inventors: Nader Pakdaman, Los Gatos, CA (US); James S. Vickers, Jamaica Plains, MA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/440,866

(22) Filed: May 19, 2003

(65) Prior Publication Data

US 2003/0202255 A1 Oct. 30, 2003

Related U.S. Application Data

(62) Division of application No. 10/052,011, filed on Jan. 16, 2002, now Pat. No. 6,594,086.

(51) Int. Cl.$^7$ ................................................ G02B 21/02
(52) U.S. Cl. ........................ 359/656; 359/661; 359/368
(58) Field of Search ................................. 359/368, 656, 359/657, 658, 659, 660, 661

(56) References Cited

U.S. PATENT DOCUMENTS

| | | | |
|---|---|---|---|
| 3,436,459 A | 4/1969 | Harrick | 359/256 |
| 3,524,691 A | 8/1970 | Klem et al. | 350/177 |
| 3,711,186 A | 1/1973 | O'Connor | 356/211 |
| 3,912,378 A | 10/1975 | Goto | 350/216 |
| 4,002,107 A | 1/1977 | Maeda | 350/229 |
| 4,353,618 A | 10/1982 | Hagner et al. | 350/91 |
| 4,625,114 A | 11/1986 | Bosacchi et al. | 250/311 |
| 4,634,234 A | 1/1987 | Baumann | 350/111 |
| 5,004,307 A | 4/1991 | Kino et al. | 350/1.2 |
| 5,208,648 A | 5/1993 | Batchelder et al. | 356/237 |
| 5,220,403 A | 6/1993 | Batchelder et al. | 356/345 |

(List continued on next page.)

FOREIGN PATENT DOCUMENTS

| | | |
|---|---|---|
| DE | 4244268 A1 | 7/1994 |
| EP | 0 977 192 A1 | 2/2000 |
| JP | 11273132 | 8/1999 |
| WO | WO 97/41556 | 11/1997 |

OTHER PUBLICATIONS

Reflected Light Contact Microscope, Brumberg et al., 1972.
Resonant Frustrated–total–reflection technique for the Characterization of thin films, Bosacchi et al. Applied Optics, vol. 21, No. 12 pp. 2167–2173 (1982).
Solid Immersion Microscopy, S.M. Mansfield, Ch. 2 and 6, Report No. 4949, Stanford University, 1992.
Modern Optical Engineering, Warren J. Smith, McGraw–Hill, pp. 230–236, 1966.
OLK–2 Adaptor for Contact Microscopy, Brumberg et al. Optical technology, vol. 38, No. 12, 1971.

*Primary Examiner*—Ricky Mack
*Assistant Examiner*—Brandi Thomas
(74) *Attorney, Agent, or Firm*—Joseph Bach; J B Patents.com

(57) ABSTRACT

A bi-convex solid immersion lens is disclosed. Unlike conventional plano-convex solid immersion lenses having a flat bottom surface, the disclosed lens has a convex bottom surface. The radius of curvature of the bottom surface is smaller than that of the object to be inspected. This construction allows for a more accurate determination of the location of the inspected feature, and enhances coupling of light between the immersion lens and the inspected object. The disclosed lens is particularly useful for use in microscope for inspection of semiconductor devices and, especially flip-chip (or chip scale) packaged devices. The immersion lens can also be incorporated in a read or read/write head of optical memory media.

20 Claims, 6 Drawing Sheets

U.S. PATENT DOCUMENTS

| | | | |
|---|---|---|---|
| 5,247,392 A | 9/1993 | Plies | 359/661 |
| 5,282,088 A | 1/1994 | Davidson | 359/664 |
| 5,497,359 A | 3/1996 | Mamin et al. | 369/44.15 |
| 5,764,613 A | 6/1998 | Yamamoto et al. | 369/112 |
| 5,939,709 A | 8/1999 | Ghislain et al. | 250/216 |
| 6,229,600 B1 | 5/2001 | Martynov | 356/123 |
| 6,270,969 B1 | 8/2001 | Hartley et al. | 435/16 |
| 6,441,359 B1 * | 8/2002 | Cozier et al. | 250/216 |
| 6,594,086 B1 * | 7/2003 | Pakdaman et al. | 359/656 |
| 6,621,275 B2 * | 9/2003 | Cotton et al. | 324/537 |
| 2002/0135891 A1 | 9/2002 | Kimura et al. | 359/795 |

\* cited by examiner

BI-CONVEX SOLID IMMERSION LENS

This application is a division of 10/052,011 filed Jan. 16, 2002 now U.S. Pat. No. 6,594,086.

BACKGROUND OF THE INVENTION

1. Field of the Invention

The present invention relates to solid immersion lenses, especially to such solid immersion lenses to increase and optimize the spatial resolution and light collection efficiency of optical imaging and collection systems.

2. Description of Related Art

Optical spatial resolution is defined as the ability of an imaging system to clearly separate closely placed structures. Optical resolution is of particular importance for those who image objects in applications such as optical metrology, lithography and astronomy.

In an ideal world optical imaging elements would have infinite size where the maximum amount of light could be focused onto and/or collected from the object under investigation. The wave nature of light combined with the limited aperture of optical elements lead to diffraction—the interference of light as it scatters from the discontinuity and recombines with the light was transmitted from other areas of the optical element.

In reality optical elements are limited size and light waves diffract as they travel through these elements and recombine from the aperture of these elements. Spatial resolution in real optical systems is adversely impacted by aberrations of the optical elements with finite aperture, fields of view and their material properties, amongst other factors.

There are many elements that need to be understood and compensated to optimize the performance of an optical system. Ideally optical elements would be impervious to the different wavelengths (color) of light and thereby not impact resolution and optical performance by chromatic aberrations. Ideally these elements would also be impervious between the light transmitted and focused at the areas close to their axis (paraxial), as opposed to those transmitted and focused further from their axis. This variation for radially symmetric elements is called spherical aberration. For a review of these aberrations, amongst others, their classification, and methods to properly compensate and optimize an optical imaging system the reader may refer to classical texts on optics.

In the following we will describe an optical element and method of use to enhance and increase the resolution capabilities of high-resolution imaging with minimal aberration correction to image objects and structures embedded in the material through the sample.

Even the best optimally designed optical system where the aberrations have been properly addressed and minimized the ultimate limitation is finite aperture size of the system leading to diffraction. Therefore we will focus our attention on diffraction-limited (resolution only limited by diffraction) optical systems. Various analytical expressions have been developed to define spatial resolution in a diffraction-limited system of an optical imaging system. These formulae and expressions all relate the fundamental properties of the illuminating light and the ability of the imaging system to couple into and collect light from the sample. For example, one way to use analytical expression for the resolution is to define the lateral spatial resolving power of an optical system is to resolve a grating of period T with a lens capable of focusing and collecting light within a half-cone $\theta_0$ (FIG. 10a):

$$T = \alpha \lambda_0 / (n^* \sin \theta_0) \qquad (1)$$

Wherein $\lambda_0$ is twice wavelength of light in vacuum and "n" is the refractive index of the medium (i.e. for air $n_0=1$, $\lambda=\lambda_0$ the wavelength of light in air/vacuum. For a medium of refractive index n, $\lambda=\lambda_0/n$). The proportionality constant, $\alpha$, is defined by the resolution criteria, i.e. $\alpha=0.61$ in the often-used Rayleigh resolution criterion, or $\alpha=0.5$ for the Sparrow resolution criterion, amongst other oft used criterion. The maximum half-angle of the cone of light relates to the numerical aperture (NA), of the lens according to:

$$NA = n^* \sin \theta_0 \qquad (2)$$

Therefore one obtains the relationship:

$$T = \alpha \lambda_0 / (NA) \qquad (3)$$

Consequently, efforts to increase spatial resolution have concentrated on either increasing the NA or using a light of a shorter wavelength. The NA can be increased by proper designing of the objective to increase the solid angle cone of light that is focused and collected to and from the sample, while reducing the wavelength is achieved by using a different illuminating source, for example, a laser light source or a narrow-filtered broad spectrum light source of for a shorter wavelength.

In the case where the structure under investigation is embedded in a material with an index of refraction $n_1$, due to refraction, the half-cone angle inside the material ($\theta_1$) is related through half-cone angle in air ($\theta_0$) (FIG. 10b) through the expression $$n_0 \sin(\theta_0) = n_1 \sin(\theta_1) \text{ (FIG. 10b)} \qquad (4)$$

Although the (sinus of the) cone angle is reduced by a factor of $n_0(n_1)$, the wavelength is also reduced by the same factor. Therefore the NA is conserved, and the effective resolution of the imaging system remains unchanged. However the off normal incident (axis) rays bending at the air-medium interface introduce spherical aberrations and axial coma, which in turn reduce the image fidelity and overall resolution.

It must also be noted that in any imaging system the ability to maximize coupling and collection light onto and from the sample under inspection is critical to the imaging performance. Since more light focused and collected from the area of interest translates into larger signal (information). When the area of interest is embedded in a material, light reflected from the sample and incident on the material-air interface outside of the critical angle ($\theta_0 = \sin^{-1}(n_0/n_1)$) is reflected back into the sample (total internal reflection) and is not collected.

In summary, the larger the difference between the refractive indices of the imaging system and the embedded object the smaller the cone angle of focus and the higher the total internal reflection (loss of light from the sample). Therefore the goal is to reduce and compensate for the abrupt transition in refractive indices between the lens focusing element (i.e. microscope objective) and the embedded object. The optimum would be to 'match' the refractive indices.

Traditionally to compensate for this reduction in resolution and collection the air gap between the objective lens and sample is filled with a fluid with a refractive index matching to that of the material, 'index-matching fluid'. In many microscopes built for biological studies, the specimen is under a cover glass with a refractive index close (~1.5) to that of the sample. The index-matching fluid used to "bridge" between the cover-glass and embedded specimen would match as nearly as possible to the refractive indices. The objective lens in this index-matching set-up is also designed and optimized to image through the higher index fluid.

The enhancement in resolution with liquid is limited by the index of refraction of the fluid being used. The index of refraction of silicon is approximately 3.5, whereas the index of refraction of index-matching fluids is approximately 1.6. If the interface between the lens and the object is removed, then the NA of the optics can take full advantage of the higher index of refraction of transparent solid material. For example, in the case of silicon, the index of refraction is approximately 3.5. In cases where matching the refractive index of the material is not possible (for reason such as availability of fluids with matching refractive index or operational and implementation considerations), the 'matching' is achieved with a solid material. Obviously a primary 'index-matching' candidate material would be an element constructed from the same material as that of the object under study.

Although the goals are similar for solid index matching and fluid index matching (increasing the coupling and collection of light into and out of the sample) there is a major difference in their implementation and constraints on the overall optical system. Whereas fluids are malleable and easily fill in the gap between the lens and object, solid immersion elements must be designed to physically fit in and optically match to the imaging system. With the flat sample-air interface and the goal to couple over the largest solid angle (and not simply to extend the light further into space) the traditional solid immersion optical element by its nature is designed with a flat (interface to the sample) an symmetric curved convex surface (away from the sample). This curved surface could be a cylinder (e.g. U.S. Pat. No. 4,625,114) or a spherical design (e.g. U.S. Pat. No. 4,634,234) and because of its curvature acts as a positive focusing lens, thereby aptly called solid immersion lens (SIL). The SIL is very similar to the first (looking from the sample) plano-convex focusing/collection element in many traditional microscope objectives. Whereas liquid matching is only a light coupling mechanism, solid immersion has a fixed focusing aspect in addition.

Of course, one may use both immersion techniques, i.e., use solid immersion lens and index matching fluid. The use of the above techniques is disclosed in, for example, U.S. Pat. Nos. 3,524,694, 3,711,186, and 3,912,378 and Modern Optical Engineering, Warren J. Smith, McGraw-Hill, pp. 230–236, 1966. More modern discussions of immersion lenses can be found in U.S. Pat. Nos. 5,004,307, 5,208,648, and 5,282,088. For a proper understanding of the novel and advantageous features of the present invention, the reader is especially encouraged to review the later three patents, and Solid Immersion Microscopy, M. Mansfield, Standford University Doctoral Thesis G.L. Report 4949, March 1992.

Prior art solid immersion lenses are plano-convex. That is, the bottom surface, i.e., the surface facing the object, is flat, while the top surface, i.e., the surface facing the objective lens is convex. FIGS. 1a–1c depict three immersion lenses corresponding to the later cited three patents. In FIGS. 1a–c, the object to be imaged is identified as 100. FIGS. 1a and 1b correspond to the class solid immersion lenses that could be called normal incident hemispheres, whereas 1c is an aplanatic focusing element.

The immersion lens, 110, depicted in FIG. 1a is a hemisphere. That is, the flat surface of the plano-convex lens passes at the radial geometrical center, GC, of the upper hemispherical surface. Notably, all the light rays are perpendicular to the convex surface at the point of entry/exit. In U.S. Pat. No. 5,004,307 lens 110 is described as being further ground as exemplified in FIG. 1a by broken lines 111. This is done in order to allow for mounting, but does not affect the optical properties of the lens as being a hemisphere, as explained by one of the inventors in his Ph.D. Dissertation, Solid Immersion Microscopy, M. Mansfield, Stanford University, March 1992.

On the other hand, the flat surface of the lens, 120, depicted in FIG. 1b passes "above" the radial geometrical center, GC of the upper surface. Notably, it is designed so that its geometrical center is at the focus point inside the object to be imaged. That is, lens 120 is used to image features embedded inside of a transparent object 100. In order to create continuity of index of refraction, it is suggested to use index matching material 125. In this configuration, light rays are perpendicular to the convex surface at the point of entry/exit (Note: in U.S. Pat. No. 5,208,648 the rays are depicted at an angle other than 90°; however, the present inventors believe otherwise. For example, compare the drawings in the '648 patent to those in the above cited Dissertation).

Another variation is depicted in FIG. 1c, wherein the flat surface passes "below" the radial geometrical center GC, of lens 130. The location of the flat surface is determined from the index of refraction of: the lens, the material surrounding the lens, and the object to be imaged. Such an immersion lens is referred to as "aplanatic" lens and is covered by U.S. Pat. No. 5,282,088 to Davidson, which is assigned to the assignee of this Application. In this configuration, light rays are not perpendicular to the convex surface at the point of entry/exit. As it can be seen from simple ray-tracing designs, the magnifying power of the "aplanatic" is stronger than the normal incident hemispheres.

In usage, the lenses depicted in FIGS. 1a–1c are "coupled" to the imaged object. That is, the lens is "coupled" to the object so as to allow communication of evanescent waves. In other words, the lenses are coupled to the object so that they capture rays propagating in the object at angles higher than the critical angle (the critical angle is that at which total internal reflection occurs). As is known in the art, the coupling can be achieved by, for example, physical contact with the imaged object, very close placement (up to about 200 nanometers) from the object, or the use of index matching material or fluid.

The prior art immersion lenses suffer from the following problems:

First, since the bottom surface is flat, it is difficult to pinpoint the location of the focus point, i.e., it is hard to specify exactly what point on the object is being imaged. This is an important issue when imaging very small objects, such as electronic circuits embedded in semiconductor (i.e. Silicon, or GaAs) devices.

Second, since the bottom surface is flat, it has a large contact area. That is, as is known in the prior art, one method of index matching without the use of an index matching fluid is to simply make the immersion lens contact the object to be imaged. However, such contact should be minimized when imaging sensitive semiconductor devices in order to avoid introducing defects, such as contamination and scratching.

Third, since the sample's surface may not be perfectly flat (as is the case with semiconductors), the flat surface of the lens will basically have only a three-point contact with the sample's surface. Consequently, it is difficult to ensure that the flat surface of the immersion lens is "parallel" and optically coupled to the surface of the sample over the entire area of contact.

SUMMARY

Accordingly, it is an object of the present invention to provide an immersion lens which embodies the advantages of the prior art immersion lenses, while avoiding certain disadvantages of the prior art immersion lenses.

The immersion lens of the present invention can be in the form of any of the prior art immersion lenses, especially those depicted in FIGS. 1a–1c. However, in contrast to the prior art lenses, the invention lens has a convex lower surface. That is, the inventive immersion lens is bi-convex immersion lens, rather than plano-convex.

Since the inventive bi-convex lens has a convex lower surface, it allows for accurate determination of the point of focus. Moreover, the convex lower surface minimizes the point of contact with the imaged object and avoids the tree-point contact problem. Additionally, the inventive lens provides additional coupling by using minimal pressure over the sample.

DETAILED DESCRIPTION

Figure 1A:
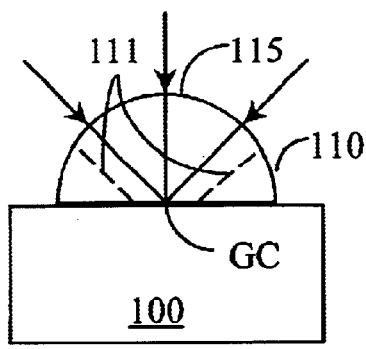
FIGS. 1a–1c depict three solid immersion lenses according to the prior art.
Figure 1C:
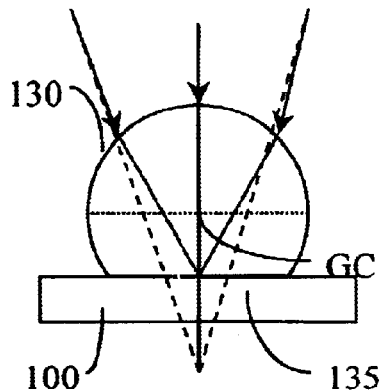
Figure 1B:
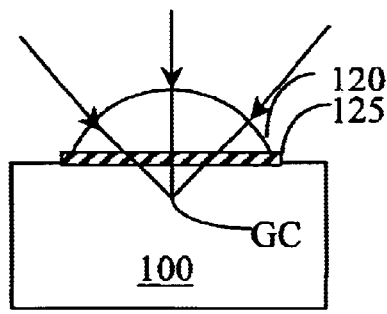
Figure 2A:
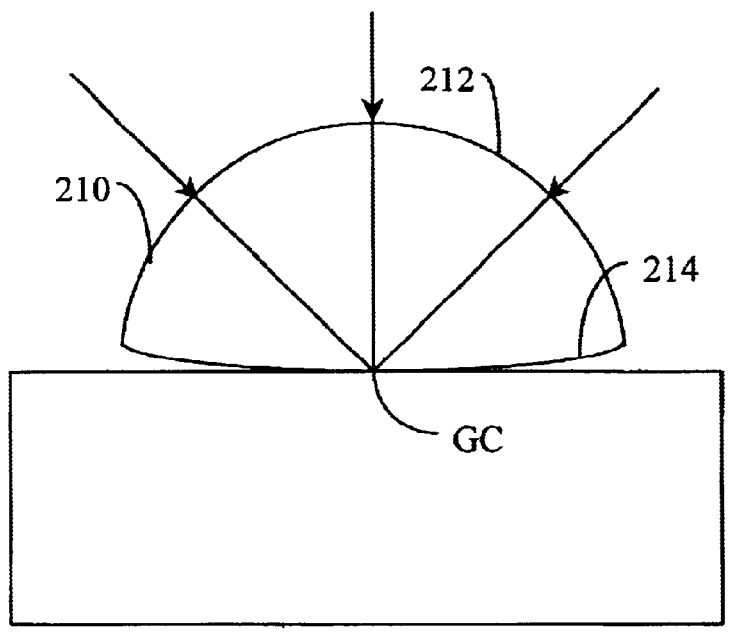
FIGS. 2a and 2b depict a first and second embodiments of the inventive solid immersion lens.

FIG. 2a depicts a first embodiment of the inventive bi-convex immersion lens 210. Specifically, the upper surface 212 is convex in the form of a hemisphere with radial geometrical center at GC. The bottom surface 214 is convex, but having a radius of curvature that is much larger than that of the upper surface. The radius of curvature of the bottom surface, 214, is, for example, an order of magnitude larger than that of the upper surface 212. The lowest point of the bottom surface, 214, passes through the radial geometrical center, GC, of the upper surface.

In usage, it is advantageous to have the lowest point of the bottom surface come in contact with the object to be imaged, while the periphery of the bottom surface at a few tens of nanometers therefrom. However, lens 210 can also be used with a gap of up to about 200 nanometers from the object, wherein the gap is filled with either air or index matching material or fluid. In such a configuration, the periphery of the bottom surface would be a few tens of nanometers further from the object than the lowest point.

Since in the embodiment of FIG. 2a the bottom surface, 214, is convex, it has a small and defined "point of contact" with the object. Note that even if the lens does not contact the object, almost all the radiation energy transmitted between the lens and the object would pass through the lowest point of the convex bottom surface 214 of the lens, which is loosely defined herein as the "point of contact." The small and defined point of contact allows for accurate determination of the point on the object that is being imaged. Also, it minimizes physical interactions between the lens and the object.

Figure 2B:
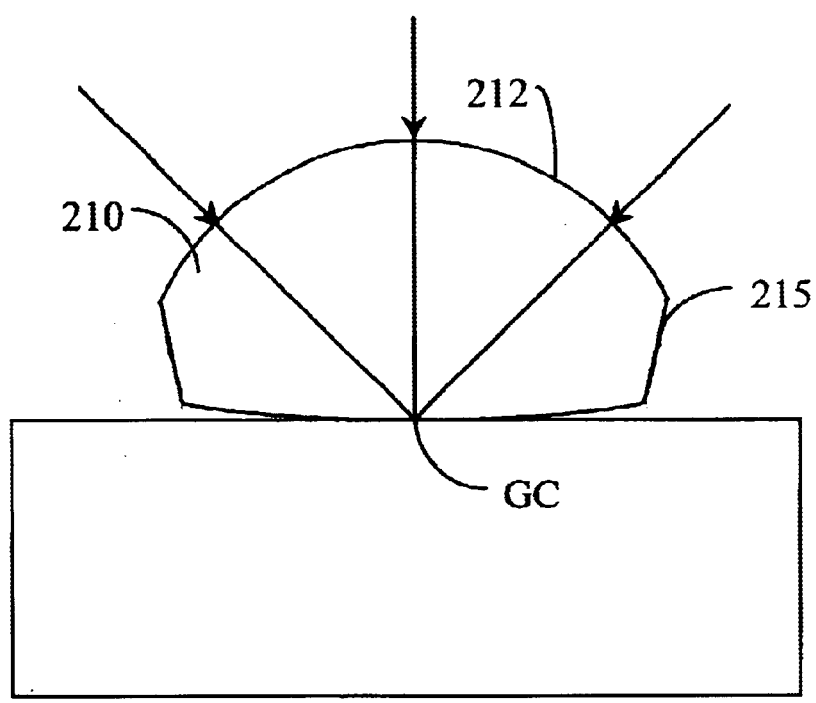

FIG. 2b depicts a modified embodiment of the SIL of FIG. 2a. Notably, the SIL of FIG. 2b has beveled edge 215. The beveled edge 215 may enable easier set up in the SIL holder. According to one method of producing the SIL of FIG. 2b, first a hemisphere is generated. Then the edge around the hemisphere is cut and beveled. Then the bottom surface is contoured to the desired contour radius. While the bevel option is shown herein only with respect to the SIL of FIG. 2a, it should be readily apparent that all the inventive SIL's shown herein can be provided with such a bevel.

Figure 3:
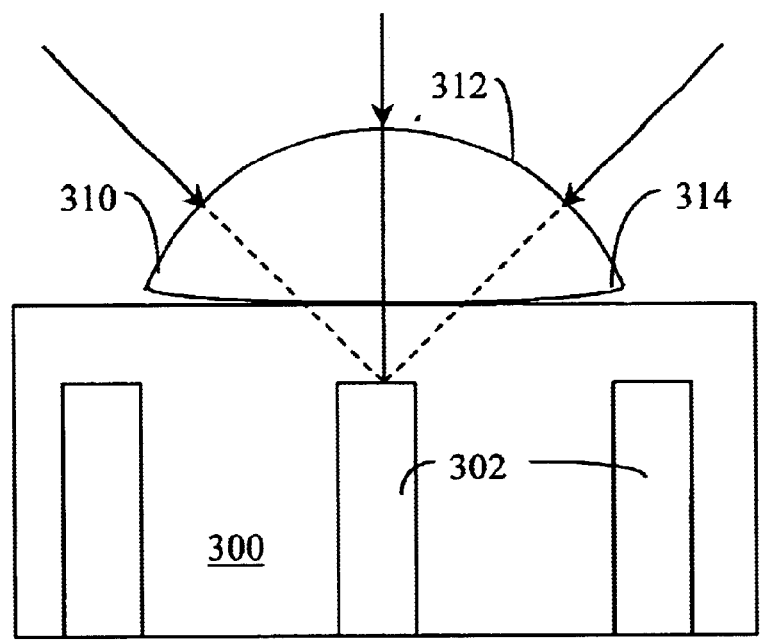
FIG. 3 depicts a third embodiment of the inventive solid immersion lens.

FIG. 3 depicts another embodiment of the inventive immersion lens. In this embodiment, the bottom surface 314 is designed in the same manner as described with respect to the embodiment of FIG. 2, except that it passes "above" the radial geometrical surface, GC, of the upper surface 312. This configuration is particularly suitable for imaging features imbedded in a transparent object. Specifically, this configuration is suitable for imaging features imbedded inside a semiconductor, from the backside of the semiconductor. This is depicted in FIG. 3, wherein 300 designate the substrate, while 302 designate features within the substrate. Such imaging configuration is particularly desirable for examination and analysis of "flip chips."

Figure 4:
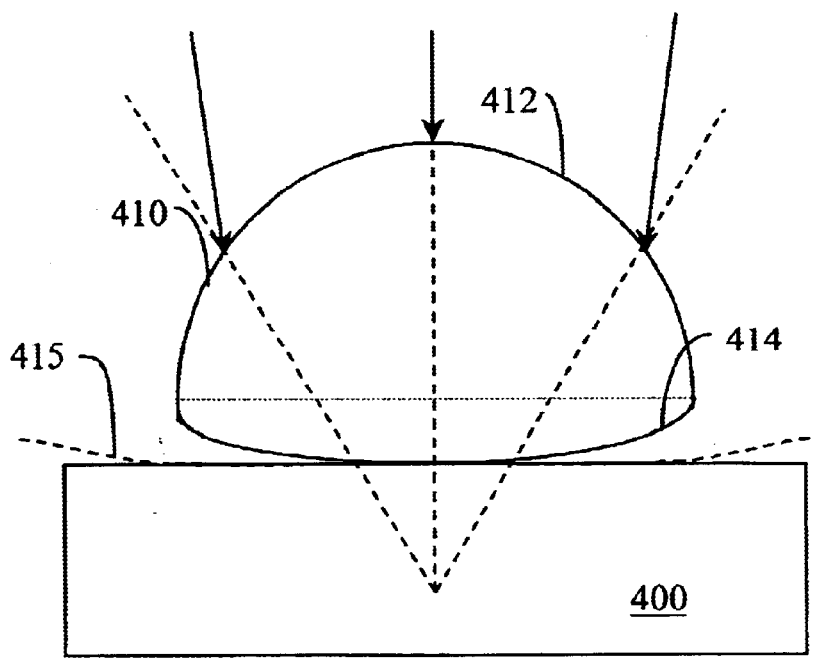
FIG. 4 depicts a fourth embodiment of the inventive solid immersion lens.

FIG. 4 depicts another embodiment of the present invention. In this embodiment, the bottom surface 414 is also designed in the same manner as described with respect to the embodiment of FIG. 2, except that it passes "below" the geometrical surface, GC, of the upper surface 412. This configuration is also useful for examination of embedded features, especially samples such as flipchip packaged integrated circuits where direct optical access to the transistors and active elements could be achieved through the silicon substrate. As noted above, an advantage of this configuration is that it allows a larger working distance between the upper surface 412 and the objective lens (not shown).

As can be understood from the above description, one advantage of the inventive immersion lens is that it provides a small and defined "point of contact" so that the exact location being imaged can be accurately determined. The small and defined point of contact also minimizes any physical interactions between the lens and the object imaged, thereby minimizing the possibility of introducing defects onto the imaged object.

The radius of curvature of the bottom surface may be much larger than that of the upper surface. At any rate, the radius of curvature of the bottom surface should be less than that of the surface to be inspected. That is, if the surface to be inspected is flat, i.e., radius of curvature being infinity, then the bottom surface may have any radius of curvature that is less than infinity. On the other hand, if the surface to be inspected is curved, the radius of curvature of the bottom surface should be smaller than the radius of curvature of the inspected surface. This is demonstrated by the broken line 415 in FIG. 4, which illustrates a curved surface of substrate 400.

For advantageous results, the lens should be "coupled" (in direct contact) to the object so as to capture evanescent surface waves. In other words, the lens should be coupled to the object so that it captures rays propagating in the object at angles higher than the critical angle. Coupling can be achieved by physical contact between the SIL and the inspected object. However, in some applications the inventive SIL provide additional coupling capability when a force is exerted on the SIL so as to be pressed against the inspected object.

Figure 11:
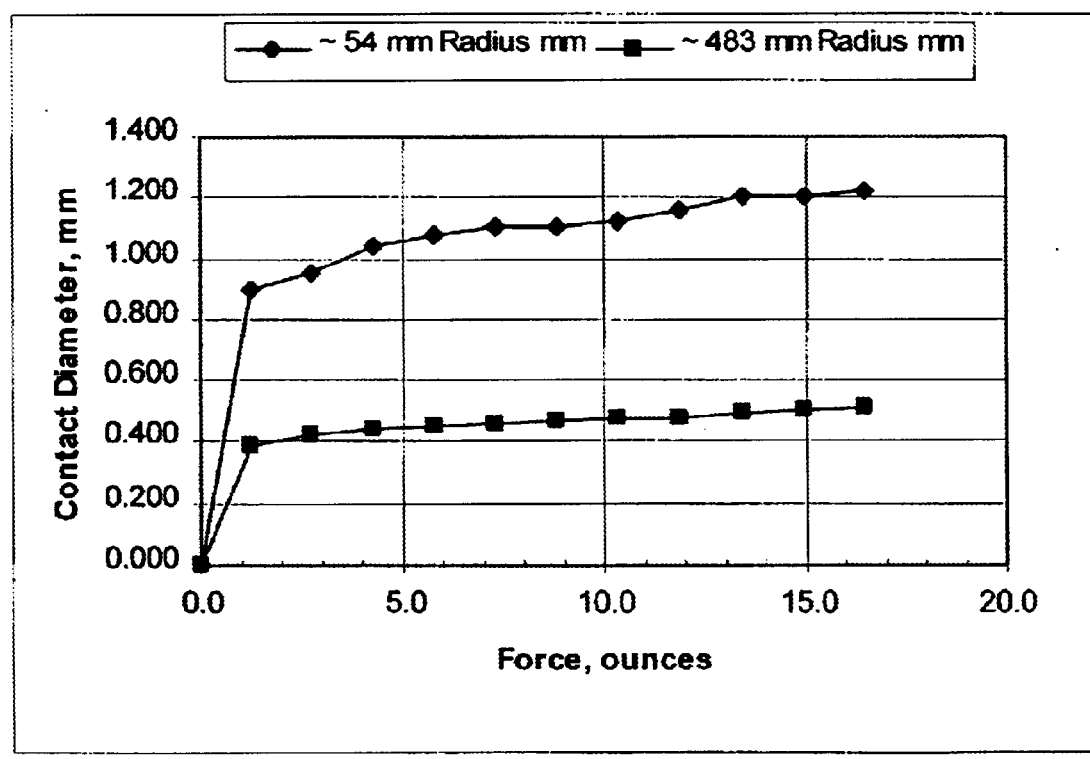
FIG. 11 is a graph of the contact versus applied force for two solid immersion lenses according to embodiments of the present invention.

For example, in microscopy of entrenched structures, the areas of interest are embedded in thin and relatively malleable samples. In particular, in semiconductor IC optical metrology samples are typically thinned to approximately 50 to 150 microns. In flipchip packages these samples are bonded on a solder array that leads to a non-flat (wavy) and compliant structure, without compromising the electrical performance of the IC. Using the inventive SIL, one can exerted minimal force on the SIL to achieve enhanced collection efficiency. FIG. 11 shows the force required as a function of contact diameter (area) between a bi-convex SIL with a typical thinned (from 500–600 micron to approximately 120 microns) flipchip IC sample for two SILs having different surface curvatures. The relatively minimal force required for a 1 mm contact area shows the malleable nature of the sample.

For best optical coupling and imaging results, the index of refraction of the immersion lens should match that of the object being imaged. Examples for appropriate materials when inspecting in glass are: Schott-58 glass, Schott LaKN-22 and Schott LaSF-9. For IC applications in Silicon, a lens made of silicon will provide a matching index.

The inventive immersion lens has applications in the investigation of flip-chips. Specifically, it has been determined by the inventors that when a bi-convex immersion lens is used to probe a flip-chip by contacting the backside of the chip and exerting a relatively small pressure, the chip bends slightly; thereby assisting in coupling the lens to the chip. This bending has been tested and proved successful without damaging the chip, or altering is electrical and/or dynamic (timing) characteristics. Specifically, a bi-convex lens having the following dimensions was manufactured:

radius of top surface: 3 mm;
radius of bottom surface: ~54 mm;
thickness/height: 2.9 mm
index of refraction (silicon): 3.5.

Adequate coupling was observed with either the top or bottom surface pressed against the chip at a reasonably non-destructive force. Accordingly, it was demonstrated that a SIL having a curved bottom surface enhances light collection efficiency from an IC. Of course, these dimensions are not limiting and are given only as a demonstrative example.

Figure 5:
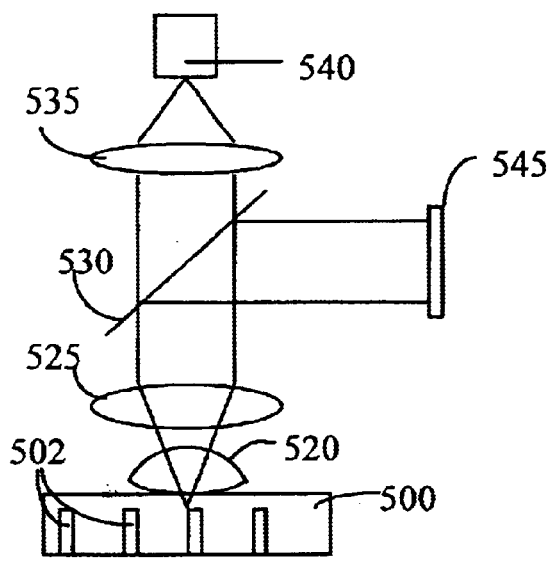
FIG. 5 exemplifies a microscope incorporating a solid immersion lens according to an embodiment of the present invention.

FIG. 5 exemplifies a microscope incorporating the immersion lens of FIG. 3, according to an embodiment of the present invention. The beam from a light source 540 is collimated by lens 535, and passes through a partially transmitting mirror 530. The collimated light is then brought to focus by objective lens 525, into a point inside the object 500. Prior to entering the object, the focused rays pass through the immersion lens 520. The immersion lens 520 is coupled to the object, so that evanescent wave energy can be transmitted to and from the object via the immersion lens.

Light exiting the upper surface of the object is then captured by the immersion lens 520. The immersion lens 520 is made of a high index of refraction material (for example, that of the sample) and is optomechanically coupled to the object. Consequently, this effectively increases the numerical aperture of the (original non-SIL) objective 525 and captures rays propagating inside the object at angles larger than the critical angle. Thus, spatial resolution is increased and features of smaller size can be resolved inside the object.

The light passes from the immersion lens 520 into the objective 525, and then reflects from the mirror 530 towards the detector 545. The detector 545 may be an appropriate camera (i.e. CCD or vidicon array), an eyepiece, or both (using diffractive and/or reflective optics in a known manner).

It should be appreciated, that the microscope exemplified in FIG. 5 can utilize any of the inventive immersion lenses described herein. Specifically, the modified aplanatic lens depicted in FIG. 4 can also be used for imaging inside an object. The lens of FIG. 2 can be used when it is desirable to image features on the surface of the object, rather then embedded features.

Figure 6:
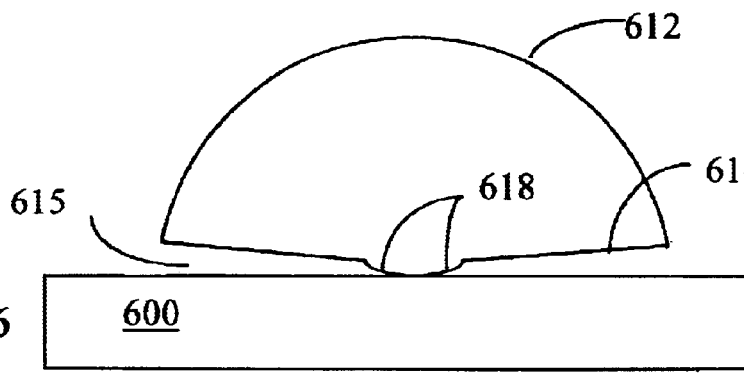
FIG. 6 depicts a fifth embodiment of the inventive solid immersion lens.

A variation of the inventive lens is depicted in FIG. 6. Specifically, the immersion lens of FIG. 6 has a convex upper surface 612, similar to that of the lenses depicted in FIGS. 2–4. The bottom surface of the immersion lens is ground so that is has a small and defined curved contact surface 618, and surrounding receding surface 616. In use, the curved contact surface 618 is coupled to the object by either making it contact the object, or brining it very close to the object, i.e., within up to 200 nanometers. The receding surface is designed to be several tens of nanometers above the point of contact so as to create gap 615. The receding surface can be either sloped (as depicted) or flat. In this example, the curved contact surface 618 is convex and have a radius of curvature smaller than that of the upper surface 612.

Figure 7:
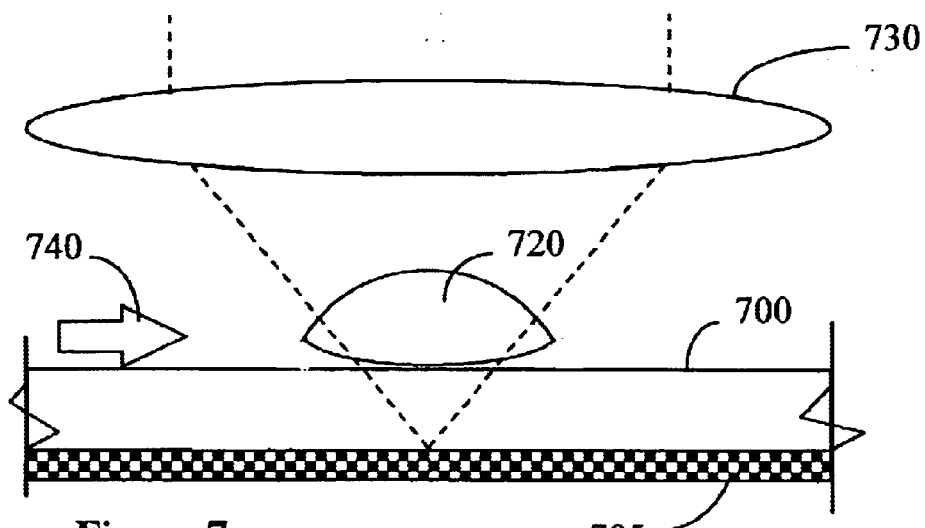
FIG. 7 exemplifies the use of the inventive lens in optical storage applications.

Another application of the inventive SIL is in optical data storage systems. High numerical aperture is also desirable in optical storage applications, such as CD, CD-ROM and DVD, wherein it enhances the data readout of the storage system and allows increase in the data density. Such a system is exemplified in FIG. 7. Specifically, the memory medium is in the form of a substrate 700 and read/write surface 705, which may include pits or phase shift features in a manner known per se. An immersion lens 720, in the form of any of the immersion lenses disclosed herein, is used to collect the light reflected from the media and relay it to the objective 730. The immersion lens can be rigidly or flexibly coupled to the objective lens in a single read or read/write head structure. The single structure is surfing above the media on an air cushion created by airflow due to the rotation of the media. In FIG. 7 the airflow is generally indicated by arrow 740.

Figure 8:
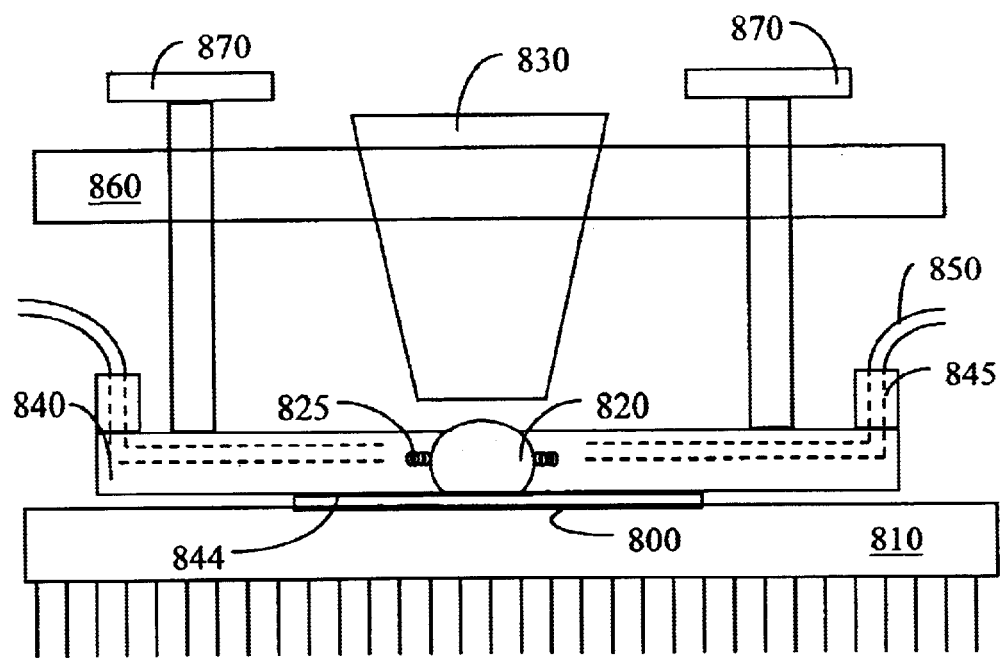
FIG. 8 depicts the general construction of a test apparatus using the inventive immersion lens and a holding plate, according to an exemplary embodiment of the present invention.
Figure 9:
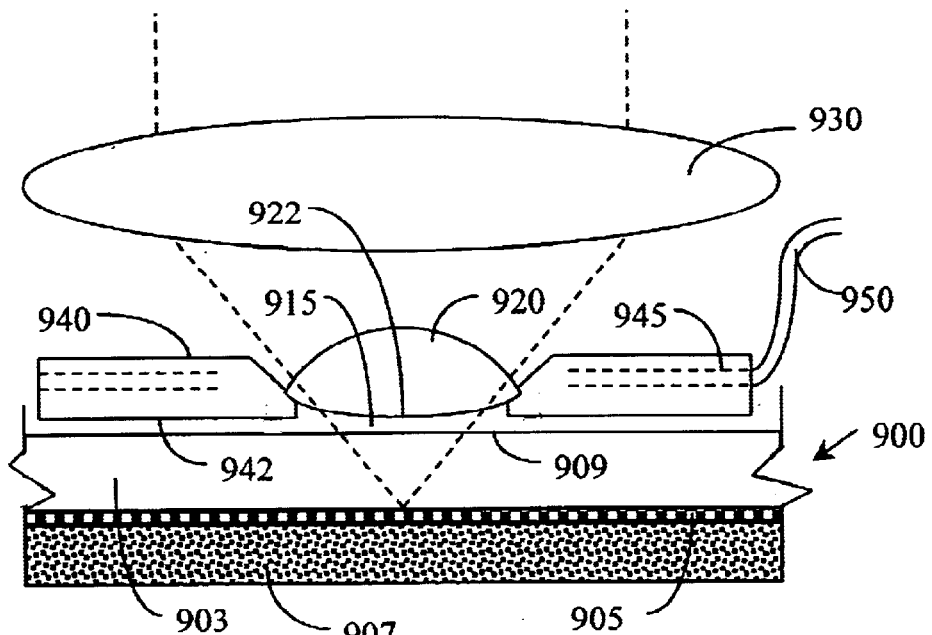
FIG. 9 depicts the relevant details of the test apparatus of FIG. 8, according to an exemplary embodiment of the present invention.
Figure 10A:
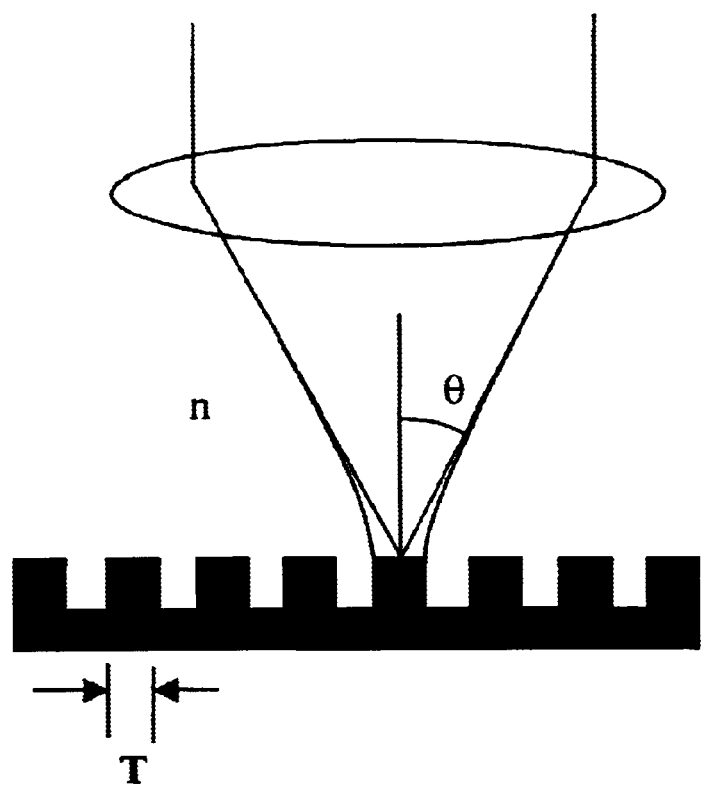
FIGS. 10a–10b depict general prior art optical systems.
Figure 10B:
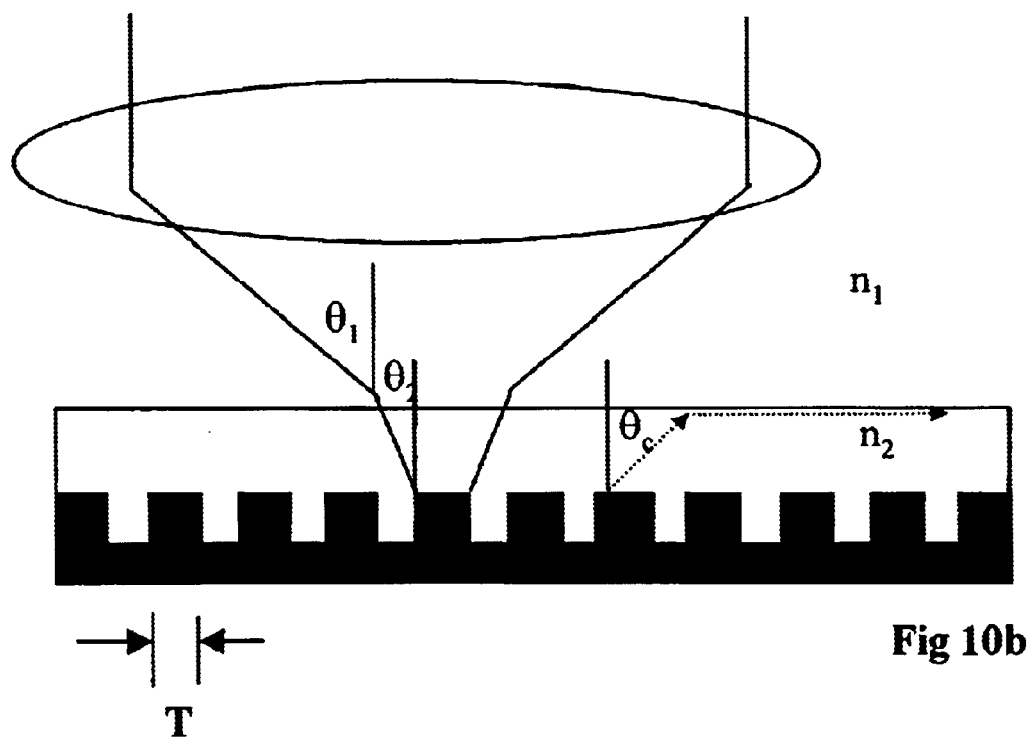

FIG. 8 depicts the general construction of a test device according to an exemplary embodiment of the present invention, while FIG. 9 depicts the relevant details in a somewhat enlarged view. This test device is particularly useful for imaging and in particular time-resolved emission (hot-electron collection of light) for switching (dynamic and timing) and other tests of flip chips. The flip chip 800 (900 in FIG. 9) is mounted onto carrier 810 (not shown in FIG. 9) so as to provide electrical connectivity thereto. As depicted in FIG. 9, flip chip 900 comprises a clear insulating substrate layer 903, a first active layer 905 (such as the transistors' source/drain diffusion layer), and further device layers 907 (such as metal interconnect layers). For timing tests, the first active layer 905 is the layer of interest, and the optics is structured so that the active layer 905 is in the focus plane.

As further shown in FIG. 8, the immersion lens 820 is positioned in a carrier 840 and is elastically held in place by attachments 825. In the embodiment of FIG. 8, the carrier 840 includes a slide plate 844 having a highly polished bottom surface, which extends slightly beyond the bottom surface of the immersion lens. To further explain this feature, reference is made to FIG. 9 that depicts an enlarged view of this feature. Specifically, in FIG. 9 the carrier 940 itself serves as the slide plate. For that reason, its bottom surface 942 is highly polished and extends beyond the bottom surface 922 of the immersion lens 920. As shown in FIGS. 8 and 9, cooling fluid channels (845, 945) are made inside the carrier (840, 940) and fluid is supplied to the channels via hoses or pipes (850, 950). The cooling fluid can be gas or liquid and are used to dissipate heat from the flip-chip.

According to one manner of operation, the bottom surface of the carrier is brought into contact with the bottom surface of the flip chip, and is used to slide the immersion lens over the chip so as to be positioned in the appropriate places for tests. A first advantage of this feature is that the distance between the bottom surface of the lens and the surface of the chip is mechanically kept constant. A second advantage of this feature is that scratching and grinding of the bottom surface of the immersion lens against the chip is avoided. A third advantage is that the carrier dissipates heat from the device under test.

On the other hand, since the bottom of the lens does not contact the surface of the flip chip, light coupling is not optimal. Therefore, in an alternate embodiment, the bottom surface of the SIL extends beyond the bottom surface of the carrier. Using this arrangement, the SIL is "picked and placed" onto various locations on the flip-chip, and no sliding occurs in order to avoid scratches.

The reader's attention is now directed back to FIG. 8 for a further explanation of the operation of the testing device. In order to move the immersion lens from point to point on the device under test, the carriage 840 is connected to a x-y-z stage 860. It is contemplated that for relatively large moves, the carriage 840 will be lifted from the device, moved to the new location, and then be lowered again to contact the device. For fine adjustments, the carriage may be moved across the device's surface, or the lens "picked and placed" onto a new location. It should be appreciated, that the same function could be accomplished by attaching the optical lenses to a fixed structure, while attaching the device to be tested to a x-y-z stage.

Stage 860 further includes manipulators 870 for fine Z adjustment. Specifically, the manipulators 870 are used to control the distance between the immersion lens and the objective 830 for focus adjustment and pressure control. The manipulators 870 may be controlled by a known per se autofocus system.

Another feature of the invention will now be described. Specifically, as can be seen in FIG. 9, a small cavity 915 is formed between the immersion lens and the surface 909 of the device under testing. If the distance between the bottom surface 922 of the immersion lens and the bottom surface 909 of the device is small (e.g., up to 200 nm), this cavity may be left to contain only air. However, in the alternative embodiment, index-matching fluid is provided inside this cavity. This will enhance the imaging capability of the testing device, and will assist in reducing friction when the carriage is moved. In practice, it is envisioned that the index-matching fluid will be provided on top of the device's surface 909, and then the carriage will be lowered onto the device.

In one embodiment, the upper convex surface of the lens is coated with an anti-reflectance material. Since the design of the lens makes all rays enter/exit the upper surface at 90 degrees, coating is drastically simplified since the thickness of the coating would be the same on the entire convex surface.

While the invention has been described with reference to particular embodiments thereof, it is not limited to those embodiments. Specifically, various variations and modifications may be implemented by those of ordinary skill in the art without departing from the invention's spirit and scope, as defined by the appended claims.

What is claimed is:

1. An arrangement for imaging a semiconductor specimen using a bi-convex immersion lens, comprising:
   a semiconductor specimen;
   a bi-convex solid immersion lens coupled to said specimen so as to capture evanescent wave energy from said specimen;
   wherein said lens comprise:
      an upper convex surface having a first finite radius of curvature and a first boundary;
      a bottom convex surface having a second finite radius of curvature and a second boundary; and,
      wherein said first and second boundaries coincide.

2. The arrangement of claim 1, wherein the second radius of curvature is larger than the first radius of curvature.

3. The arrangement of claim 1, wherein the specimen comprises and imaged area having a local radius of curvature and wherein said second radius of curvature is smaller than the local radius of curvature.

4. The arrangement of claim 1, wherein the bottom surface passes through the radial geometrical center of the upper surface.

5. The arrangement of claim 1, wherein the bottom surface passes above the radial geometrical center of the upper surface.

6. The arrangement of claim 1, wherein the bottom surface passes below the radial geometrical center of the upper surface.

7. The arrangement of claim 2, wherein the bottom surface passes through the radial geometrical center of the upper surface.

8. The arrangement of claim 2, wherein the bottom surface passes above the radial geometrical center of the upper surface.

9. The arrangement of claim 2, wherein the bottom surface passes below the radial geometrical center of the upper surface.

10. The arrangement of claim 1, wherein said upper convex surface further comprises an anti-reflective coating.

11. The arrangement of claim 1, wherein said upper surface comprises a hemisphere.

12. The arrangement of claim 1, wherein said lens comprises silicon.

13. The arrangement of claim 2, wherein said upper surface comprises a hemisphere.

14. The arrangement of claim 3, wherein said upper surface comprises a hemisphere.

15. The arrangement of claim 4, wherein said upper surface comprises a hemisphere.

16. The arrangement of claim 5, wherein said upper surface comprises a hemisphere.

17. The arrangement of claim 6, wherein said upper surface comprises a hemisphere.

18. The arrangement of claim 10, wherein said upper surface comprises a hemisphere.

19. A method for imaging a flat, rigid, specimen using a bi-convex immersion lens, comprising:

situating the specimen onto a carrier;

coupling the bi-convex lens onto the specimen, so that said bi-convex lens captures evanescent wave energy from said specimen;

providing an objective lens so as to collect light energy from said bi-convex lens;

wherein said bi-convex lens comprises an upper convex surface having a first finite radius of curvature and a first boundary, and a bottom convex surface having a second finite radius of curvature and a second boundary, and wherein said first and second boundaries coincide.

20. The method of claim 19, further comprising exerting pressure upon said lens so as to press lens against said specimen.

* * * * *